(12) United States Patent
Kamath et al.

(10) Patent No.: US 6,509,529 B2
(45) Date of Patent: Jan. 21, 2003

(54) ISOLATED FLIP CHIP OF BGA TO MINIMIZE INTERCONNECT STRESS DUE TO THERMAL MISMATCH

(75) Inventors: Sundar Kamath, San Jose, CA (US); David Chazan, Palo Alto, CA (US); Jan I. Strandberg, Cupertino, CA (US); Solomon I. Beilin, San Carlos, CA (US)

(73) Assignee: Kulicke & Soffa Holdings, Inc., Willow Grove, PA (US)

( * ) Notice: Subject to any disclaimer, the term of this patent is extended or adjusted under 35 U.S.C. 154(b) by 0 days.

(21) Appl. No.: 09/960,164

(22) Filed: Sep. 20, 2001

(65) Prior Publication Data

US 2002/0011353 A1 Jan. 31, 2002

Related U.S. Application Data

(62) Division of application No. 09/375,172, filed on Aug. 16, 1999, now Pat. No. 6,299,053.
(60) Provisional application No. 60/097,066, filed on Aug. 19, 1998.

(51) Int. Cl.$^7$ .................................................. H05K 1/03
(52) U.S. Cl. ........................ 174/255; 174/260; 361/707; 361/711
(58) Field of Search ................................. 174/260, 255, 174/256; 361/751, 711, 704, 792; 257/700, 758; 301/792

(56) References Cited

U.S. PATENT DOCUMENTS

| | | |
|---|---|---|
| 4,313,995 A | 2/1982 | Delgadillo |
| 4,654,248 A | 3/1987 | Mohammed |
| 4,806,195 A | 2/1989 | Namysl |
| 5,153,384 A | 10/1992 | Iijima et al. |
| 5,326,671 A | 7/1994 | Brown et al. |
| 5,349,155 A * | 9/1994 | Yamagishi et al. .... 219/121.71 |
| 5,374,344 A | 12/1994 | Gall et al. |
| 5,675,474 A * | 10/1997 | Nagase et al. ............... 361/704 |
| 5,688,350 A | 11/1997 | Hamilton et al. |
| 5,700,549 A * | 12/1997 | Garant et al. ................. 361/171 |
| 5,719,749 A | 2/1998 | Stopperan |
| 5,727,310 A | 3/1998 | Casson et al. |
| 5,804,771 A | 9/1998 | McMahon et al. |
| 6,028,364 A * | 2/2000 | Ogino et al. ................. 174/255 |
| 6,121,553 A | 9/2000 | Shinada et al. |
| 6,175,158 B1 | 1/2001 | Degani et al. |

FOREIGN PATENT DOCUMENTS

| | | | |
|---|---|---|---|
| EP | 0 044 247 A1 | 1/1982 | ............ H05K/3/40 |
| EP | 0 064 854 A1 | 11/1982 | ............ H01L/23/14 |
| EP | 0 260 857 A2 | 3/1988 | ............ H01L/23/48 |
| EP | 0 605 090 A1 | 7/1994 | ......... H01L/21/316 |
| JP | 404260354 | * 9/1992 | |
| WO | WO 89/09534 | 10/1989 | ............ H05K/1/18 |

OTHER PUBLICATIONS

Beilin et al., *Derwent* 2000–246607 (Jul. 2000).
Beilin et al., *Derwent* 2000–246620 (Jul. 2000).

* cited by examiner

*Primary Examiner*—Albert W. Paladini
(74) *Attorney, Agent, or Firm*—Townsend and Townsend and Crew LLP

(57) ABSTRACT

A wiring substrate with reduced thermal expansion stress. A wiring substrate, such as a laminated PWB, thin film circuit, lead frame, or chip carrier accepts an integrated circuit, such as a die, a flip chip, or ball grid array package. The wiring substrate has a thermal expansion stress reduction insert, void, or constructive void in a thermal expansion stress region proximate to the integrated circuit. The thermal expansion stress reduction insert or void may extend a selected distance from the edge or edges of the integrated circuit attachment area. The thermal expansion stress reduction insert or void improves the flexibility of the wiring substrate in the region that is joined to the integrated circuit, thus reducing thermal stress between components of the wiring substrate-integrated circuit assembly. In another embodiment, layers of a laminated wiring substrate are intentionally not bonded beneath the chip attach area, thus allowing greater flexibility of the upper layer of the laminate.

16 Claims, 3 Drawing Sheets

ISOLATED FLIP CHIP OF BGA TO MINIMIZE INTERCONNECT STRESS DUE TO THERMAL MISMATCH

CROSS-REFERENCES TO RELATED APPLICATIONS

This application is a division of U.S. application Ser. No. 09/375,172 now U.S. Pat. 6,299,053, filed Aug. 16, 1999, entitled ISOLATED FLIP CHIP OR BGA TO MINIMIZE INTERCONNECT STRESS DUE TO THERMAL MISMATCH, having Sundar Kamath, David Chazan, Jan I. Strandberg and Solomon I. Beilin listed as co-inventors; which claims priority from U.S. Provisional Application No. 60/097,066, entitled ISOLATED FLIP CHIP OR BGA TO MINIMIZE INTERCONNECT STRESS DUE TO THERMAL MISMATCH, having Sundar Kamath an David Chazan listed as coinventors, filed Aug. 19, 1998. This application also related to U.S. application Ser. No. 09/375,175, entitled IMPROVED WIRING SUBSTRATE WITH THERMAL INSERT, having Sundar Kamath, David Chazan and Solomon Beilin listed as coinventors, the disclosures of Ser. No. 09/375,172; No. 60/097,066 and Ser. No. 09/375,175 are herein incorporated herein by reference in their entirety.

BACKGROUND OF THE INVENTION

A major problem facing manufacturers of wiring substrates, such as printed wiring boards ("PWBs"), chip carriers, and VLSI substrates, is the management of thermal expansion stresses between the materials of the substrate, in the case of a laminated substrate, and between the materials of the substrate and components mounted on the substrate.

Thermal stresses can arise in at least two situations. One situation is when a thermal gradient is present. A higher temperature in one area of the substrate, such as underneath a heat source, can cause thermal expansion relative to a cooler area of the substrate, even if the substrate is made of a single material. The effects of this situation can often be mitigated by slowly changing temperature, thus lowering the thermal gradient.

A second situation is when materials with different coefficients of thermal expansion ("CTE") are used. One material then expands and contracts at a different rate (typically expressed as a dimensionless coefficient, e.g. mm/mm, per degree of temperature) than the other as the temperature changes. Differential CTEs can cause problems regardless of the rate at which the materials are heated or cooled. If the materials are bonded or otherwise attached together, thermal stress is generated when the temperature changes. This stress can result in deformation (warping) or even fracture of the material, in order to relieve the stress.

For example, PWBs are typically formed by laminating several layers of different materials together. Conductive layers, such as copper layers patterned according to a desired wiring layout, are typically separated by, and laminated to, dielectric layers that provide electrical insulation between the conductive layers. The dielectric layers are typically polymeric resins, such as epoxy resins. The dielectric layers often have a CTE of about 50–70 ppm/° C., while the metals used in the conductive layers have a CTE of about 16–17 ppm/° C. Thus, a heat source placed on a PWB or similar wiring substrate can create thermal stress.

The increased complexity of contemporary integrated circuits affects the problems arising from thermal stress in many ways. First, the high device count on very-large-scale integrated circuit (VLSI") chips often means a single chip will generate more heat compared to a chip with a lower device count. The shrinking dimensions of the devices on the chips mean that the heat is often concentrated in a smaller area. Some ICs generate over 10 W/cm$^2$. The shrinking dimensions also mean that the traces on the chip are finer pitch and the contact pads on the chip also have finer pitch, not to mention that the number of contact pads has substantially increased. Finally, the overall dimensions of VLSI chips have increased in many cases. The increased dimensions result in a greater total expansion or contraction, which can lead to higher thermal stress.

A variety of technologies have been developed to address the finer contact pitch and increased number of contacts. Examples include ball-grid arrays ("BGAs"), which are packaged chips with an array of bumps, typically solder dots, on one surface of the package. The package may include a chip carrier or lead frame, with the actual semiconductor chip bonded to the carrier and the electrical contacts brought from the IC chip to the balls of the BGA. Another example are known as "flip chips", which are similar to BGA packages in that bumps, typically of solder, eutectic, or conductive adhesive, are formed over contact pads on the IC chip. The chip is then "flipped" onto a wiring substrate and bonded. Flip-chip is usually reserved to describe a type of direct chip attach, even though it is very similar to packaged BGA process.

Unfortunately, the IC package or flip chip may be made of a material, such as plastic, ceramic, or semiconductor, with a different CTE than any of the materials in the wiring substrate. To complicate matters, the finer pitch of the contact array typically means a finer wiring pattern must be used on the wiring substrate. The finer wires are not as strong as wider wires would be, and thus are more susceptible to breakage when subjected to stress. Similarly, if a shear stress develops between the IC and the substrate, a smaller solder ball will have less strength to resist the stress (including work hardening), and may fail at the joint, or may crack. A particularly insidious aspect of such failures is that an electrical contact may be established at one temperature, and not at another, as thermal expansion and contraction brings the cracked or broken halves of the electrical path together and apart.

Therefore, it is desirable to reduce the failures caused by thermal stress in wiring substrates and in assemblies of integrated circuits and wiring substrates.

SUMMARY OF THE INVENTION

The present invention provides a wiring substrate with reduced thermal expansion. The wiring substrate has a thermal expansion stress reduction insert, void, or constructive void in a thermal expansion stress region proximate to the integrated circuit. The thermal expansion stress reduction insert or void extends a selected distance from the edge or edges of the integrated circuit attachment area. The thermal expansion stress reduction insert or void improves the flexibility of the wiring substrate in the region that is joined to the integrated circuit, thus reducing thermal stress between components of the wiring substrate-integrated circuit assembly. Wiring substrates according to the present invention include laminated PWBs, thin film circuits, lead frames, or chip carriers and can accept an integrated circuit, such as a die, a flip chip, or a BGA package.

In a specific embodiment, the wiring substrate is a laminated printed wiring board with the thermal stress reduction insert or void in a layer proximate to an outer layer to which the integrated circuit is joined (mounted). In a further embodiment the thermal stress reduction insert is an elastomer, such as a siloxane. In an alternative embodiment, the wiring substrate is a thin film substrate In another embodiment, a constructive void is formed by filling a cutout portion of the inner layer with a material that thermally degrades when the laminate is processed.

In yet another embodiment, the layers of the laminate are pressed in selected regions, so that the layers in the thermal expansion stress region are not bonded.

These and other embodiments of the present invention, as well as its advantages and features, are described in more detail in conjunction with the text below and attached figures.

DESCRIPTION OF THE SPECIFIC EMBODIMENTS

The present invention provides articles of manufacture with improved thermal stress characteristics for use in wiring substrates, and methods for producing the same. As examples only, the articles of manufacture include PWBs, chip carriers, VLSI substrates, thin film substrates, and the like, as well as such substrates with an attached IC device. The IC device may be a BGA chip, a packaged BGA device, an IC with wire bonding pads, or the like, and may be attached to the substrate by any one of a variety of die attach methods, as are known in the art, including solder die attach, flip-chip, and BGA solder die attach, such as controlled collapse chip connection ("C4").

Figure 1A:
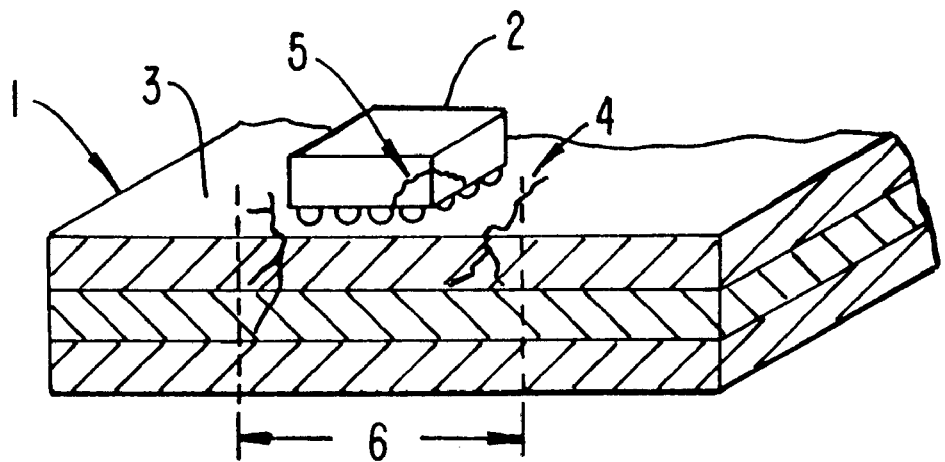
FIG. 1A is a simplified view of a laminated PWB with a BGA device mounted on a surface of the PWB.

FIG. 1A is a simplified view of a laminated PWB 1 with a BGA device 2 mounted on a surface 3 of the PWB. It is understood that a BGA device is used as an example only, and that other devices, such as a micro-BGA, flip chip, thin-film substrate (with or without an attached IC, such as a VLSI IC), or even a backside attached die could be used. The PWB is illustrated with only three layers for simplicity, and it is understood that PWBs may have several layers laminated together. For example, some PWBs may have six or more conductive layers separated by dielectric layers. Accordingly, the number of laminations shown is for example only. A wiring array (not shown for simplicity of illustration) has been patterned on the surface 3 of the PWB to accept an integrated circuit. The BGA device 2 has been electrically and mechanically attached to an attachment area on the surface of the PWB, such as by a C4 process, as is known in the art.

Cracks 4, 5 in the PWB or in the device (FIG. 1A) can form from thermal stress. Thermal stress can be generated by external thermal sources/sinks, such as a gradient formed by a change in the ambient temperature, or thermal stress can be generated by the device itself if the device generates heat during its operation. A thermal expansion stress region 6 (represented by a dashed line) can form in the area of the device. The thermal expansion stress region in the PWB is typically opposite and co-extensive with the device attachment area, and may extend about 1–5 mm past the edge of the device, depending on the thermal characteristics of the PWB and the device.

Figure 1B:
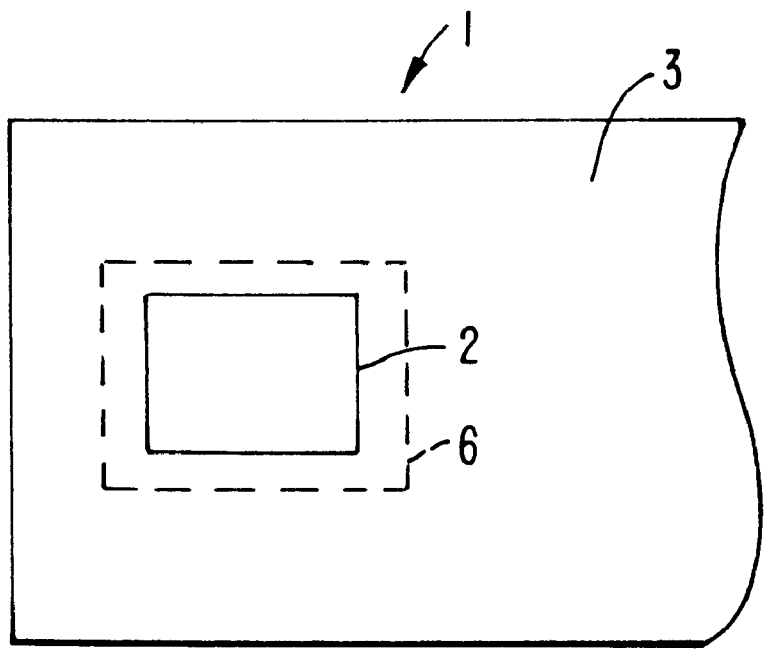
FIG. 1B is a simplified top view of a PWB with an attached device showing a thermal expansion stress region.

FIG. 1B is a simplified top view showing the thermal expansion stress region 6 formed in the PWB 1 in the area of the device 2.

Several factors affect the amount of stress arising in a particular application. As mentioned above, the size of the device affects the total displacement resulting from differential CTEs, as does the difference between the CTEs of the materials. Also, some materials are more resistant to deformation than others, and some are stronger (more resistant to breaking) than others. For example, if thermal stress is generated in a compliant material, that material can deform to release the stress, rather than cracking, even if the material is relatively weak. Conversely, if a material is relatively brittle, such as silicon, alumina-based ceramic, or single-crystal alumina ("sapphire"), the material might fail, even if the material has high inherent strength, especially if it is relatively thin. Thus, whether an assembly will fail, and where it will fail, depends on many factors. A relatively compliant material attached to a relatively stiff material can improve the reliability of an assembly of these materials.

Figure 2A:
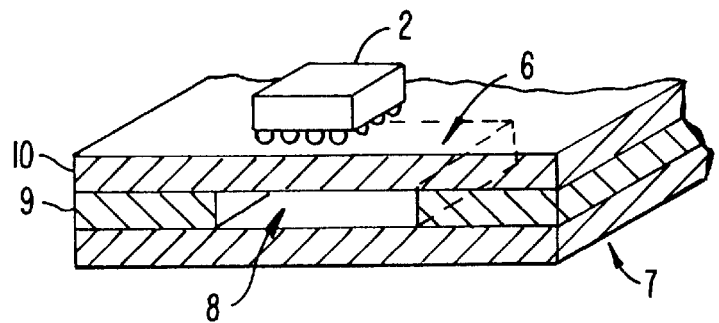
FIG. 2A is a simplified view of a PWB with a stress relief region according to another embodiment of the present invention.

FIG. 2A is a simplified view of a PWB 7 with a BGA device 2 attached on a surface of the PWB. The PWB in this figure differs from the PWB shown in FIG. 1A in that a stress relief region 8 has been formed in the PWB 2 during its manufacturing process. The stress relief region 8 is a void or a constructive void that reduces the stiffness of the laminated PWB in the thermal expansion stress relief region. A constructive void is a space that is not necessarily entirely empty. For example, the void could be filled with a filler material that does not provide significant mechanical support that might contribute to thermal expansion or contraction forces being generated in the laminate layer 9 surrounding the void, or might be partially filled with the residue of a material that decomposes during the lamination process.

Alternatively, the stress relief region could be formed by punching out a portion of the layer 9 prior to lamination of the PWB 7. The void or constructive void corresponds to the thermal expansion stress region in the area of the PWB that will underlie the attached device 2, and is essentially co-extensive with the die attach region, meaning that the thermal expansion stress region is about the same area as the die attach area, although the thermal expansion stress region may extend a few millimeters beyond the die attach area on one or more edges. Removing a region of the inner laminate layer material 9 within the thermal expansion stress region 6 allows the outer laminate layer 10 within at least a portion of the thermal expansion stress region to be more flexible. More flexibility in the outer laminate layer allows it to better compensate for the horizontal shear forces caused by its rigid attachment to an expanding chip package and so reduces or eliminates the chances of cracking in the laminate or the chip. The outer layer is bonded to the inner layer over a major portion of the interface between the two layers, but not bonded together in the stress relief region, which is typically a small fraction of the entire interface area.

Prior to lamination, the volume that will become the void or constructive void can be filled with a material, such as a polymeric foam, that degrades or decomposes during subsequent thermal treatment. It is desirable that the thermal decomposition materials decompose at at least about 10–20° C. below the processing temperature used to laminate the PWB. If foam is used, it is preferable that the foam be an inert gas foam, so that nitrogen, argon, or similar inert gas would be released upon degradation and the degradation products not unduly contribute to corrosion of the PWB assembly. It is preferable that the degradation starts below the upper layer in the lamination stack. The lamination process typically uses temperatures between about 150–170° C., so a low thermal decomposition material that decomposes between about 130–160° C. is desirable, depending on the actual processing temperatures. Such materials include polyalphamethylstyrene and polyisobytylene, for example.

Figure 2B:
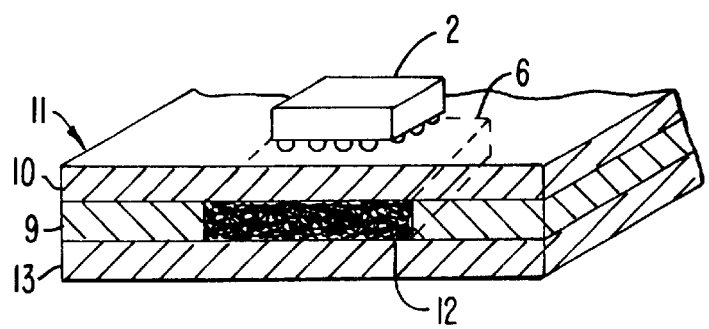
FIG. 2B is a simplified view of a PWB with a stress relief insert according to another embodiment of the present invention.

FIG. 2B is a simplified view of a laminated PWB 11 with an attached device 2 in which a stress relief material 12 has been incorporated into a layer 9 of the PWB in the thermal expansion stress region 6. The stress relief material is a compliant material that is relatively easy to elastically deform, yet adheres to the overlying 10 and underlying 13 layers of the laminated PWB. The stress relief material is, for example, silicone rubber, siloxane [—(Si(CH$_3$)$_2$O)n—] elastomer, fluorinated siloxane, fluorinated silicone rubber, or other similar material. It is desirable that the stress relief material has a modulus at least 100 times less than the modulus of the surrounding and/or overlying laminate. For example, if the laminate material has a modulus of about 2–3 GPa, siloxane with a modulus of about 0.01 kPa would be sufficient, but a material with a modulus of about 10 MPa would also be acceptable. In other embodiments, it is desirable that the stress relief material has a modulus at least 1000 times less than the modulus of the surrounding and/or overlying laminate. It is further desirable that the stress relief material not break down or un-bond from the laminate during subsequent processing, in which temperatures might reach as high as 170° C.

Figure 2C:
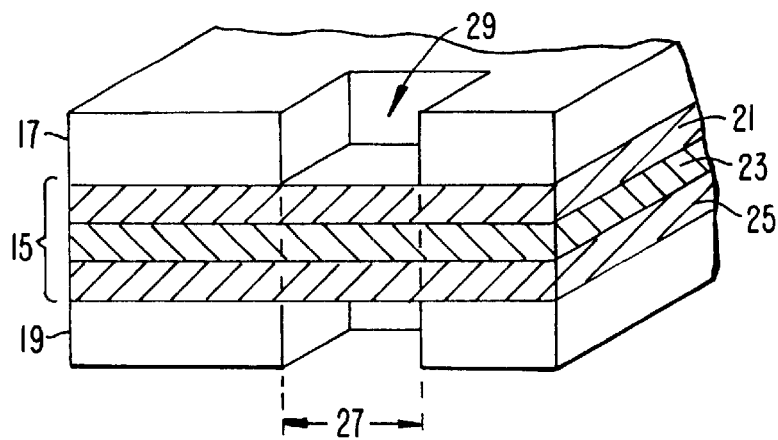
FIG. 2C is a simplified view of a PWB illustrating a processing step according to the present invention.

FIG. 2C is a simplified view of a multi-layer PWB stack 15 during a lamination process step. An upper 17 and lower 19 die press the layers 21, 23, 25 of the laminate together. At least one of the upper or lower dies, or both (as shown), has a cutout 29 in a region 27 that corresponds to a thermal expansion stress region. Thus, during the lamination process pressure is not applied to the thermal expansion stress region of the laminate, and the outer layer 21 of the laminate is not bonded to the underlying layer 23 of the laminate in this region. This allows the outer laminate layer to move independently from the inner laminate layer in that region and flex to relieve thermal stress between an attached IC and the outer layer.

Figure 2D:
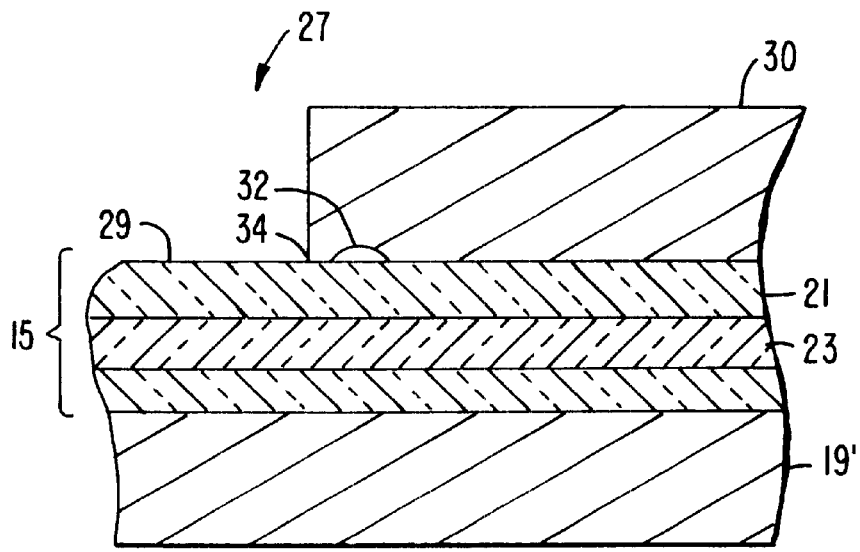
FIG. 2D is a simplified cross section showing a die used to laminate PWBs.

FIG. 2D is a simplified cross section of a die 30 used to apply pressure to selected regions of a PWB stack 15 against a second die or anvil 19' during a lamination process. The die has a cutout 27 so that pressure is selectively not applied to a possible thermal expansion stress region 29. The die is fabricated with a relief 32 near the perimeter 34 of the cutout so that pressure is concentrated around the perimeter of the unbonded thermal expansion stress region. This improves the lamination strength around the perimeter of the thermal expansion stress region and reduces the likelihood of delamination in use. Other methods to prevent or reduce delamination around the thermal expansion stress region, such as plated through holes or solder pipes (whether electrically conductive or merely structural), could also be used alternatively or in addition to lamination techniques. Of course, a plated through hole, including a solder-filled hole, need not extend through all layers of the PWB. It would be acceptable that a solder pipe, for example, merely extend through the outer layer 21 and attach to the underlying layer 23, as by soldering to a metal trace on the underlying layer. Conversely, a solder pipe could extend through the underlying layer and attach to a metal trace on the inner surface of the outer layer (at the interface with the underlying layer), thus conserving surface area near the chip attach area.

Figure 2E:
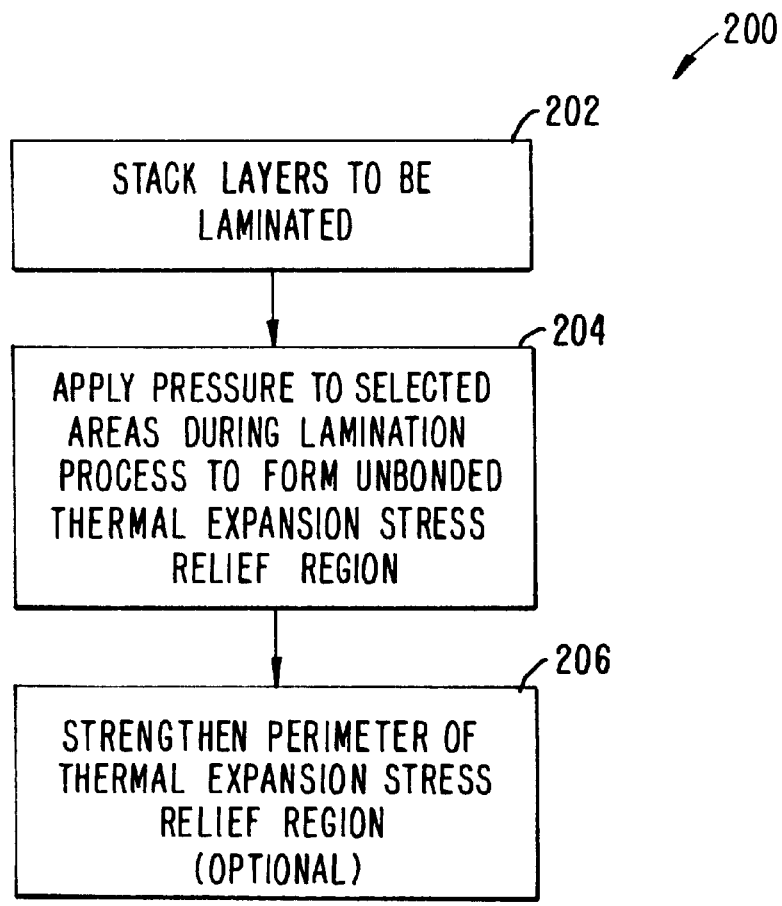
FIG. 2E is a simplified flow chart of a process according to the present invention and FIG. 2C.

FIG. 2E is a simplified flow chart of a process (200) according to the present invention. Layers to be laminated are stacked (step 202) in preparation for the lamination process. A die or dies press the layers together in selected areas (step 204) to leave un-bonded layers in anticipated thermal expansion stress regions. The perimeter of the un-bonded area may be strengthened during the lamination process, or a separate (optional) perimeter strengthening step (206), such as forming through holes through an outer layer of the laminate and soldering the through holes to an inner layer of the laminate.

Having fully described various embodiments of the present invention, other equivalent or alternative structures and methods will be apparent to those of ordinary skill in the art. For example, while embodiments have been described with laminated layers of epoxy material, it is understood that other materials could be used in one or several layers of the lamination. Other materials could include metal layers, metal-clad layers, glass-filled fluoropolymer layers, and alumina-based ceramic layers, to name but a few.

Similarly, while embodiments have been described in the context of a PWB, the invention is applicable to other types of substrates. Accordingly, the scope of the invention should not be limited by the specific embodiments described above, but rather by the following claims.

What is claimed is:

1. A multi-layer wiring substrate comprising:
   an outer layer with an outer surface and an inner surface, the outer surface having an attachment area for mounting an integrated circuit onto the outer surface of the outer layer and a peripheral area at least partially surrounding the attachment area;
   an inner layer laminated to at least a major portion of the inner surface of the outer layer, the inner layer including a thermal stress relief region opposite to and essentially co-extensive with the attachment area on the outer surface of the outer layer.

2. The multi-layer wiring substrate of claim 1 wherein the thermal stress relief region is a void or a constructive void.

3. The multi-layer wiring substrate of claim 1 wherein the thermal stress relief region is a void.

4. The multi-layer wiring substrate of claim 1 wherein the thermal stress relief region is a constructive void.

5. The multi-layer wiring substrate of claim 1 further comprising a wiring array formed over the peripheral area of the outer surface of the outer layer.

6. A multi-layer wiring substrate comprising:
   an outer layer with an outer surface and an inner surface, the outer surface having an attachment area for mounting an integrated circuit onto the outer surface of the outer layer;
   an inner layer laminated to at least a major portion of the inner surface of the outer layer, the inner layer including a thermal stress relief region opposite to and essentially co-extensive with the attachment area on the outer surface of the outer layer, wherein the thermal stress relief region is a constructive void that contains a residue from a thermal decomposition material present in the thermal stress relief region prior to a step of laminating the outer layer to the inner layer.

7. The multi-layer wiring substrate of claim 6 wherein the thermal decomposition material is selected from the group consisting of polyalphamethylstyrene and polyisobytylene.

8. A multi-layer wiring substrate comprising:

an outer layer with an outer surface and an inner surface, the outer surface having an attachment area for mounting an integrated circuit onto the outer surface of the outer layer;

an inner layer laminated to at least a major portion of the inner surface of the outer layer, the inner layer including a thermal stress relief region opposite to and essentially co-extensive with the attachment area on the outer surface of the outer layer, wherein the thermal stress relief region is filled with a compliant material.

9. The multi-layer wiring substrate of claim 8 wherein the compliant material is selected from the group consisting of siloxane elastomer, fluorinated siloxane elastomer, and fluorinated silicon rubber.

10. The multi-layer wiring substrate of claim 8 wherein the outer layer has a first modulus and the compliant material has a second modulus, the first modulus being at least 100 times greater than the second modulus.

11. A multi-layer wiring substrate comprising:

an outer layer with an outer surface and an inner surface, the outer surface having an attachment area for mounting an integrated circuit onto the outer surface of the outer layer;

an inner layer laminated to at least a major portion of the inner surface of the outer layer, the inner layer including a thermal stress relief region opposite to and essentially co-extensive with the attachment area on the outer surface of the outer layer, wherein an edge of the thermal stress relief region extends beyond an edge of the attachment area a distance of between about 1–5 mm.

12. A multi-layer wiring substrate comprising:

an outer layer with an outer surface and an inner surface, the outer surface having an attachment area for mounting an integrated circuit onto the outer surface of the outer layer;

an inner layer laminated to at least a major portion of the inner surface of the outer layer, the inner layer including a thermal stress relief region opposite to and essentially co-extensive with the attachment area on the outer surface of the outer layer, wherein the thermal stress relief region is a region where the inner layer is not bonded to the outer layer.

13. A laminated printed wiring board comprising:

a first dielectric layer of a dielectric material having a first modulus, the first dielectric layer having an outer surface and an inner surface, the outer surface having an attachment area for mounting an integrated circuit provided as a ball grid array package, a micro ball grid array package, or a flip chip onto the outer surface of the first layer;

a second dielectric layer laminated to the inner surface of the first dielectric layer and to a third dielectric layer, the second dielectric layer having a thermal stress relief region formed in the second dielectric layer between the first dielectric layer and the third dielectric layer and opposite to and essentially co-extensive with the attachment area on the outer surface of the first dielectric layer, the thermal stress relief region being filled with a compliant material having a second modulus, the first modulus being at least 100 times greater than the second modulus.

14. A laminated printed wiring board assembly comprising:

a first layer having a first modulus, the first layer having an outer surface and an inner surface, the outer surface having an attachment area;

an integrated circuit provided as a ball grid array package, a micro ball grid array package, or a flip chip attached to the attachment area of the outer surface of the first layer;

a second dielectric layer laminated to the inner surface of the first dielectric layer and to a third dielectric layer, the second dielectric layer having a thermal stress relief region formed in the second dielectric layer between the first dielectric layer and the third dielectric layer and opposite to and essentially co-extensive with the attachment area on the outer surface of the first dielectric layer, the thermal stress relief region being filled with a compliant material having a second modulus, the first modulus being at least 100 times greater than the second modulus.

15. The laminated printed wiring board assembly of claim 14 wherein the die attachment area is at least partially surrounded by a peripheral area in which a wiring array has been formed.

16. The laminated printed wiring board assembly of claim 14 wherein an edge of the thermal stress relief region extends beyond an edge of the integrated circuit attachment area a distance of between about 1–5 mm.

* * * * *